(12) United States Patent
Hsu et al.

(10) Patent No.: US 9,335,746 B2
(45) Date of Patent: May 10, 2016

(54) ELECTRONIC APPARATUS AND PROTECTING METHOD THEREOF

(71) Applicant: WISTRON CORP., New Taipei (TW)

(72) Inventors: Chia-Lung Hsu, New Taipei (TW);
Ming-Chih Chen, New Taipei (TW);
Po-Cheng Chen, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 14/484,286

(22) Filed: Sep. 12, 2014

(65) Prior Publication Data

US 2015/0137723 A1     May 21, 2015

(30) Foreign Application Priority Data

Nov. 15, 2013    (TW) .............................. 102141707 A

(51) Int. Cl.
*G05B 11/32* (2006.01)
*H01L 41/053* (2006.01)
*G06F 1/16* (2006.01)

(52) U.S. Cl.
CPC .............. *G05B 11/32* (2013.01); *G06F 1/1656* (2013.01); *H01L 41/053* (2013.01); *G06F 2200/1637* (2013.01)

(58) Field of Classification Search
CPC .......................................................... G05B 11/32
USPC .................................................. 318/466, 445
See application file for complete search history.

(56) References Cited

U.S. PATENT DOCUMENTS

| | | | | |
|---|---|---|---|---|
| 5,392,024 A | * | 2/1995 | Kiuchi | ................ B60R 21/0136 280/735 |
| 5,478,077 A | * | 12/1995 | Miyahara | ........... A63B 24/0021 273/372 |
| 6,093,897 A | * | 7/2000 | Inoue | .................... G01P 15/135 200/61.45 R |
| 6,998,759 B2 | | 2/2006 | Lee | |

* cited by examiner

*Primary Examiner* — David S Luo
(74) *Attorney, Agent, or Firm* — CKC & Partners Co., Ltd.

(57) ABSTRACT

An electronic apparatus includes a first casing, a protected device, a detector, a first actuator and a controller. The protected device is spaced apart from the first casing by a first shortest distance. The detector is configured to detect a first early sign before a first collision of the first casing and the protected device. The controller is configured to actuate the first actuator after the detector detects the first early sign, causing an increase of the first shortest distance.

19 Claims, 12 Drawing Sheets

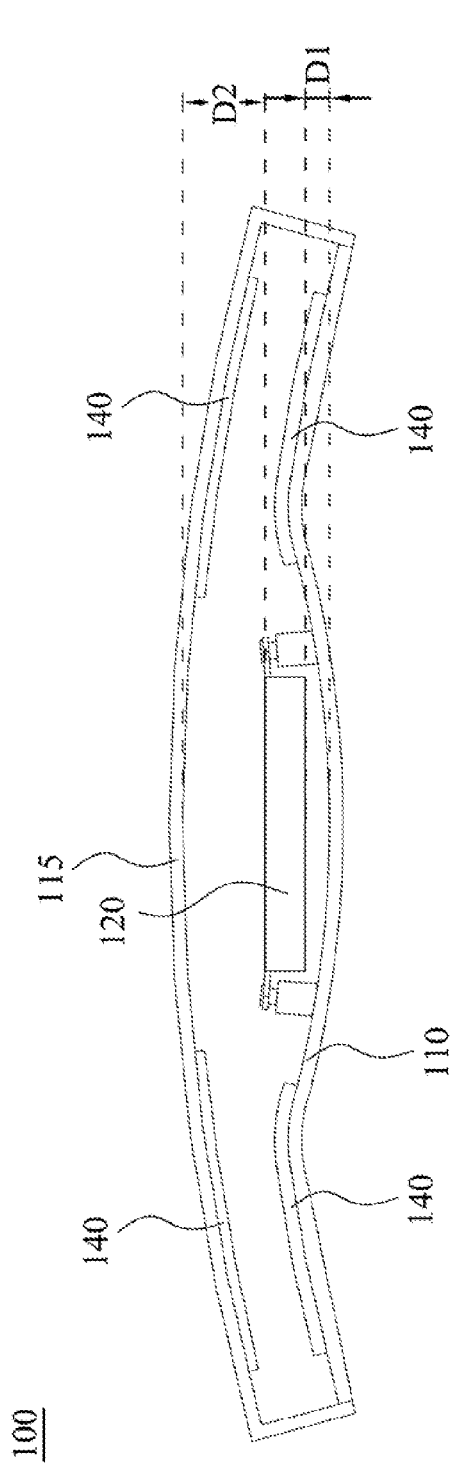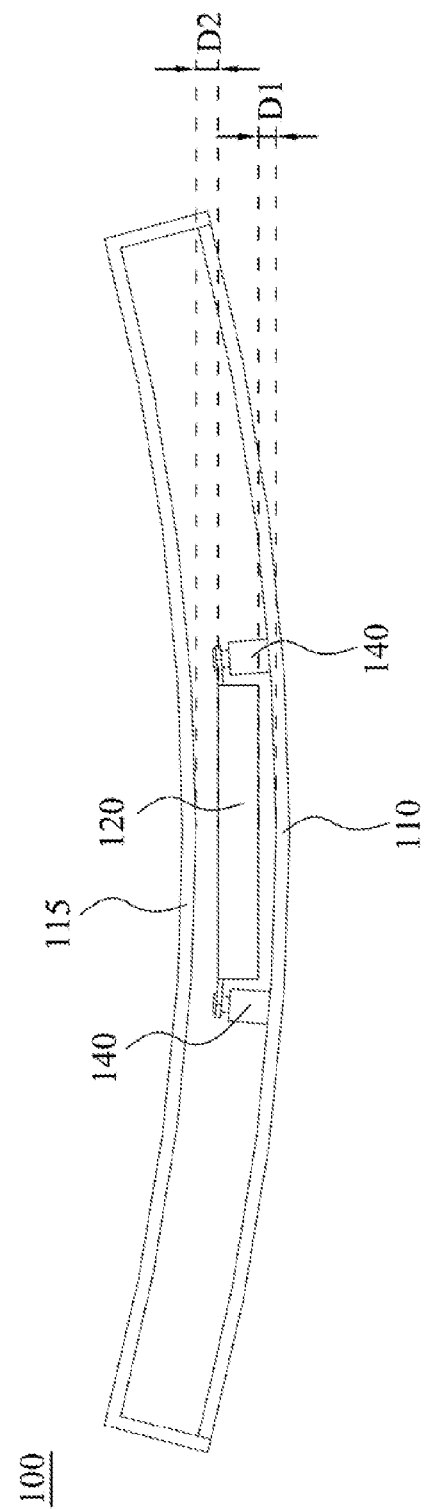

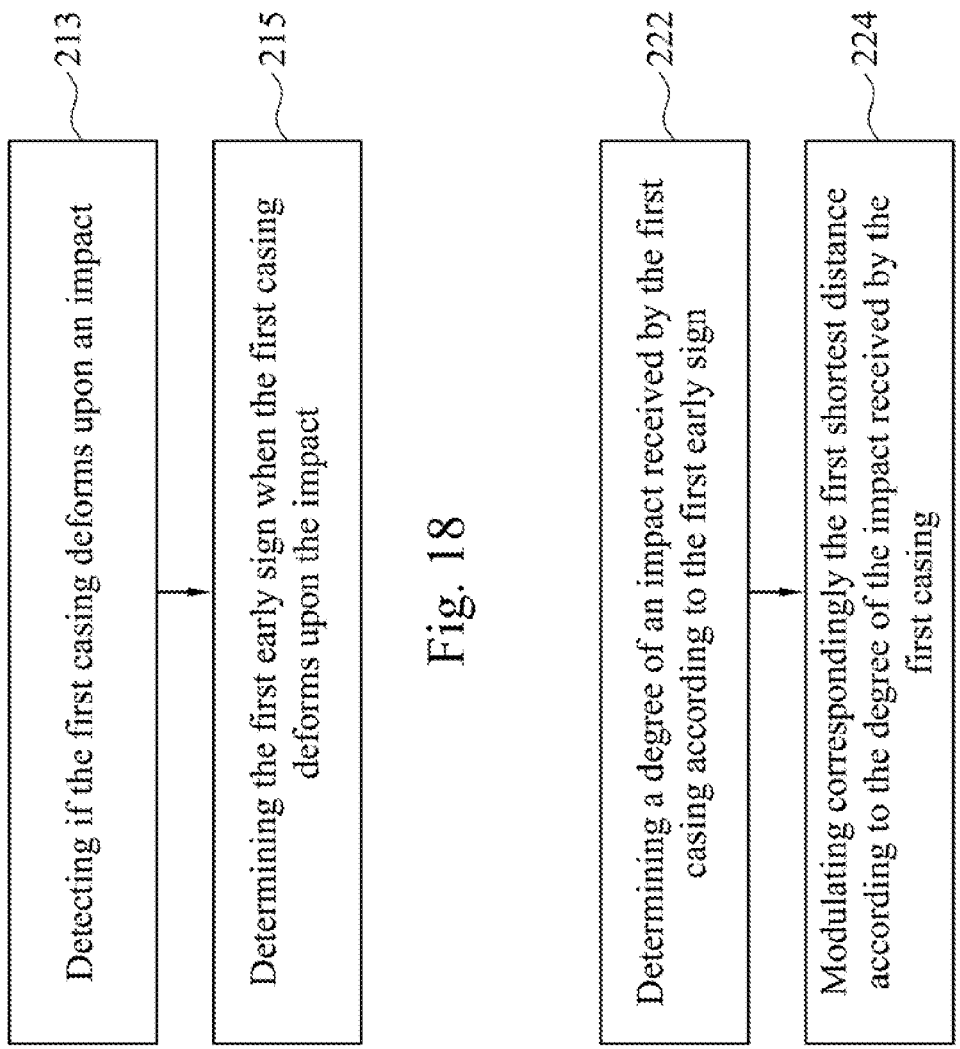

ELECTRONIC APPARATUS AND PROTECTING METHOD THEREOF

RELATED APPLICATIONS

This application claims priority to Taiwanese Application Serial Number 102141707, filed Nov. 15, 2013, which is herein incorporated by reference.

BACKGROUND

1. Technical Field

The present disclosure relates to an electronic apparatus and the protecting method thereof.

2. Description of Related Art

For an electronic apparatus configured with precision devices, if a user inadvertently drops it in carrying, the most worrying scenario will be the collision between the precision devices and the surrounding structure of the electronic apparatus. The collision may damage the precision devices.

The aforementioned issue may be addressed by simply increasing the distance between the precision devices and the surrounding structure. However, the electronic apparatus are designed to be increasingly smaller nowadays, such that the distance between the precision devices and the surrounding structure is getting narrowed. This raises the risk of the collision between the precision devices and the surrounding structure.

FIGS. 1-3 are schematic sectional views of traditional electronic apparatus upon an impact at the first casing 110. As shown in FIGS. 1-3, most of the traditional electronic apparatus includes a first casing 110 and a second casing 115, and a protected device 120 located in-between. When the first casing 110 is subject to an impact, the first casing 110 bends and deforms due to a force of the impact has shown in FIG. 2). In case the bending deformation first increases the distance between the first casing 110 and the protected device 120, not much risk of a collision is introduced of the protected device 120 and the first casing 110. However, when the first casing 110 rebounds, the bending deformation occurs at the reverse direction, as shown in FIG. 3, which decreases the distance between the protected device 120 and the first casing 110 causing the collision of the protected device 120 and the first casing 110.

Therefore, there are needs of solution in the art, which can effectively decrease the risk of collision of the precision devices and the surrounding structure with the miniaturization of the electronic apparatus.

SUMMARY

Therefore, a technical aspect of the present disclosure provides an electronic apparatus, used to solve the difficulties as mentioned in the description of related art above.

According to an embodiment of the present invention, an electronic apparatus includes a first casing, a protected device, a detector, a first actuator and a controller. The protected device is spaced apart from the first casing by a first shortest distance. The detector is configured to detect a first early sign before a first collision of the first casing and the protected device. The controller is configured to actuate the first actuator after the detector has detected the first early sign, causing an increase of the first shortest distance.

In one or more embodiments of the present disclosure, the detector includes at least one accelerometer. The accelerometer is configured to detect if the first casing is in a state of weightlessness. The first early sign is determined when the first casing is detected to be in the state of weightlessness.

In one or more embodiments of the present disclosure, the first actuator includes at least one piezoelectric piece. The piezoelectric piece is located on the first casing. After the detector has detected the first early sign, the controller makes the piezoelectric piece deform the first casing, causing the increase of the first shortest distance.

In one or more embodiments of the present disclosure, the quantity of the piezoelectric pieces is two, and the piezoelectric pieces are located respectively at opposite sides of the protected device.

In one or more embodiments of the present disclosure, the first actuator includes at least one linear actuator. The linear actuator connects the protected device and the first casing. After the detector has detected the first early sign, the controller makes the linear actuator move the protected device in a direction away from the first casing.

In one or more embodiments of the present disclosure, the controller includes an embedded controller/keyboard controller. The embedded controller/keyboard controller is configured to produce a control signal to the first actuator after the detector has detected the first early sign, so as to actuate the first actuator.

In one or more embodiments of the present disclosure, the controller further includes an operational amplifier. The operational amplifier is configured to amplify the control signal and provide an amplified control signal to the first actuator.

In one or more embodiments of the present disclosure, the controller further includes a determination unit and a modulator. The determination unit is configured to determine a degree of an impact received by the first casing according to the first early sign. The modulator is configured to modulate the control signal according to the degree of the impact received by the first casing, such that the first actuator can correspondingly modulate the first shortest distance according to the degree of the impact received by the first casing.

In one or more embodiments of the present disclosure, the detector includes at least one piezoelectric piece. The piezoelectric piece is located on the first casing and is configured to detect if the first casing deforms upon an impact. When the first casing deforms upon the impact, the first early sign is determined to be present.

In one or more embodiments of the present disclosure, the first actuator includes the said piezoelectric piece. After the detector has detected the first early sign, the controller makes the piezoelectric piece deform the first casing, causing the increase of the first shortest distance.

In one or more embodiments of the present disclosure, the electronic apparatus further includes a second casing and a second actuator. The second casing is disposed opposite to the first casing and is spaced apart from the protected device by a second shortest distance. The detector is further configured to detect a second early sign before a second collision of the second casing and the protected device. The controller is further configured to actuate the second actuator after the detector has detected the second early sign, causing an increase of the second shortest distance.

In one or more embodiments of the present disclosure, the electronic apparatus further includes a second casing and a second actuator. The second casing is disposed opposite to the first casing and is spaced apart from the protected device by a second shortest distance. The detector is configured to first actuate the second actuator after the detector has detected the first early sign, causing an increase of the second shortest distance, and then actuate the first actuator, causing the increase of the first shortest distance.

Another technical aspect of the present disclosure provides a protecting method of an electronic apparatus, used to solve the difficulties as mentioned in the description of related art above.

According to an embodiment of the present disclosure, for a protecting method of an electronic apparatus, with the electronic apparatus including a first casing, a protected device, a detector and a first actuator, in which the protected device and the first casing being spaced apart by a first shortest distance, the protecting method includes the following steps (it is appreciated that the sequence of the steps and the sub-steps as mentioned below, unless otherwise specified, can all be adjusted upon the actual needs, or even executed at the same time or partially at the same time):

(1) Utilizing the detector to detect a first early sign before a first collision of the first casing and the protected device.

(2) Actuating the first actuator after the first early sign is detected, causing an increase of the first shortest distance.

In one or more embodiments of the present disclosure, the step (1) further includes the following sub-steps:

(1.1') Utilizing the detector to detect if the first casing is in a state of weightlessness.

(1.2') determining the first early sign when the first casing is detected to be in the state of weightlessness.

In one or more embodiments of the present disclosure, the step (2) further includes the following sub-step:

(2') Making the first actuator deform the first casing, causing the increase of the first shortest distance.

In one or more embodiments of the present disclosure, the step (2) further includes the following sub-step:

(2") Making the first actuator move the protected device in a direction away from the first casing.

In one or more embodiments of the present disclosure, the step (2) further includes the following sub-steps:

(2.1) Utilizing a determination unit to determine a degree of an impact received by the first casing according to the first early sign.

(2.2) Utilizing a modulator to correspondingly modulate the first shortest distance according to the degree of the impact received by the first casing.

In one or more embodiments of the present disclosure, the step (1) further includes the following sub-steps:

(1.1") Utilizing the detector to detect if the first casing deforms upon an impact.

(1.2") Determining first early sign when the first casing deforms upon the impact.

In one or more embodiments of the present disclosure, the protecting method further includes the following steps:

(3) Utilizing the detector to detect a second early sign before a second collision of a second casing and the protected device, in which the second casing and the first casing are disposed oppositely.

(4) Actuating a second actuator after the second early sign is detected, causing an increase of a second shortest distance between the second casing and the protected device.

In one or more embodiments of the present disclosure, the protecting method further includes the following step:

(1.5) Actuating a second actuator after the first early sign is detected and before the first actuator actuates, causing an increase of a second shortest distance between a second casing and the protected device, in which the second casing and the first casing are disposed oppositely.

BRIEF DESCRIPTION OF THE DRAWINGS

The disclosure can be more fully understood by reading the following detailed description of the embodiment, with reference made to the accompanying drawings as follows.

FIGS. 12-13 are schematic sectional views of the electronic apparatus, according to the fourth embodiment of the present disclosure, upon an impact at the first casing;

FIGS. 14-15 are schematic sectional views of the electronic apparatus, according to the fifth embodiment of the present disclosure, upon an impact at the first casing;

FIG. 18 is a flow chart of the step 210 according to another embodiment of the present disclosure;

FIG. 19 is a flow chart of the step 220 of FIG. 16;

DETAILED DESCRIPTION

Figure 1:
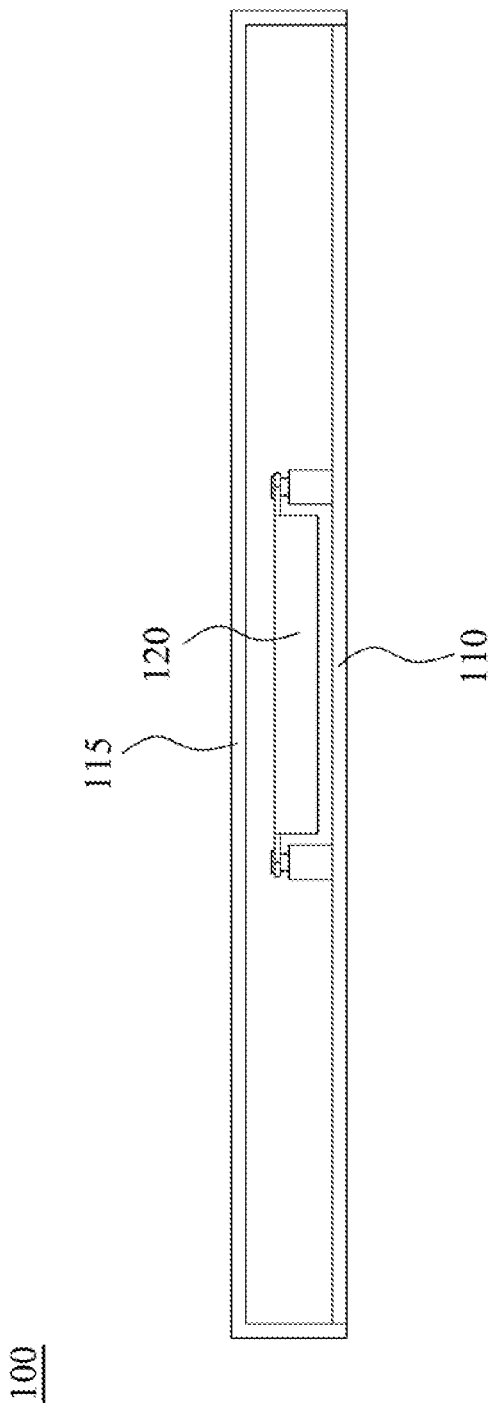
FIGS. 1-3 are schematic sectional views of traditional electronic apparatus upon an impact at the first casing.
Figure 2:
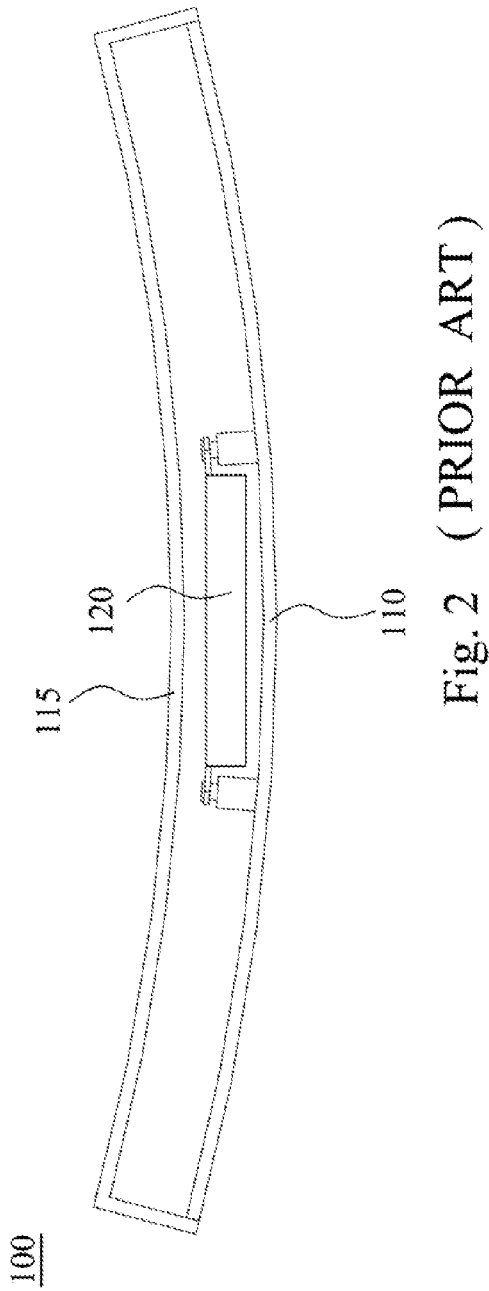
Figure 3:
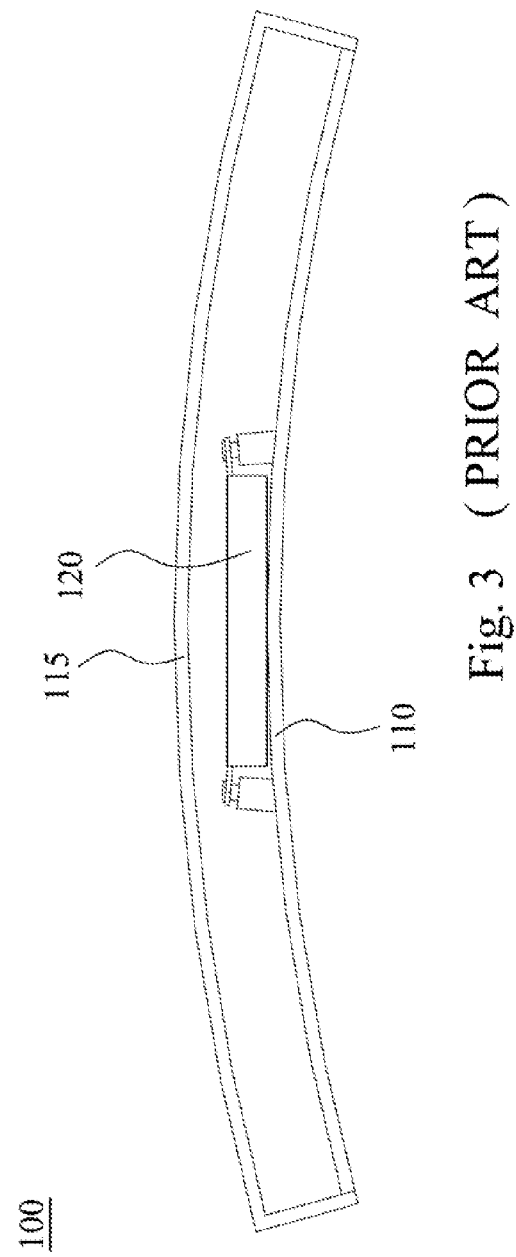

Drawings will be used below to disclose a plurality of embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

The First Embodiment

Figure 4:
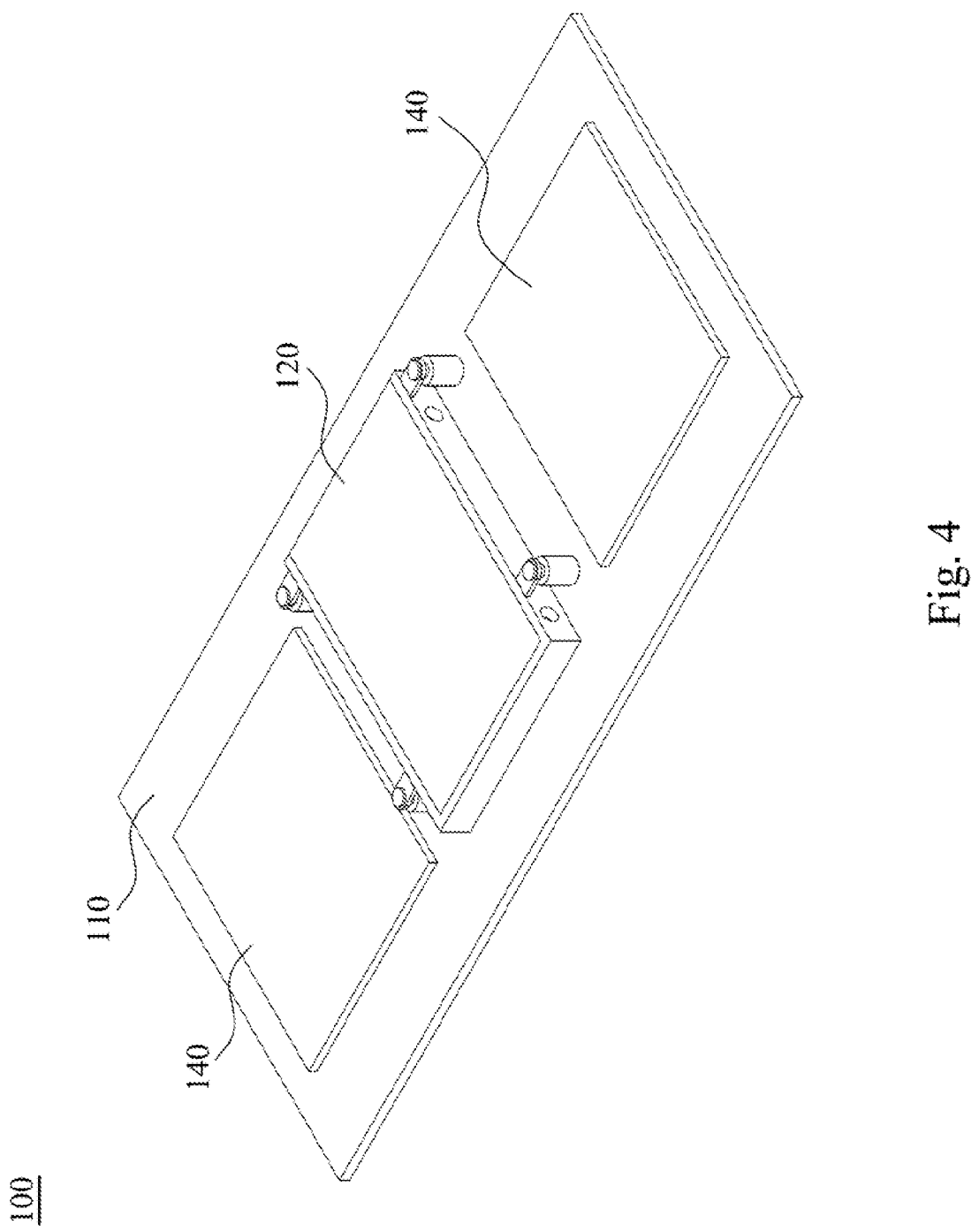
FIG. 4 is a three-dimensional drawing of the electronic apparatus according to the first embodiment of the present disclosure, in which the second casing is removed.
Figure 5:
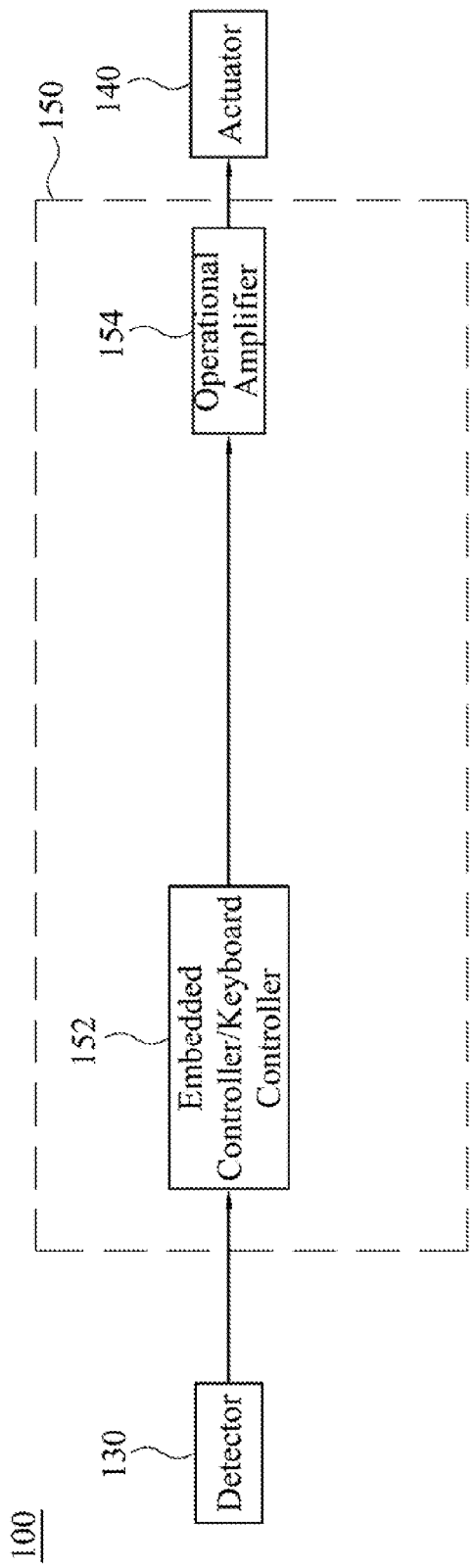
FIG. 5 is a function block diagram of the electronic apparatus of FIG. 4.
Figure 6:
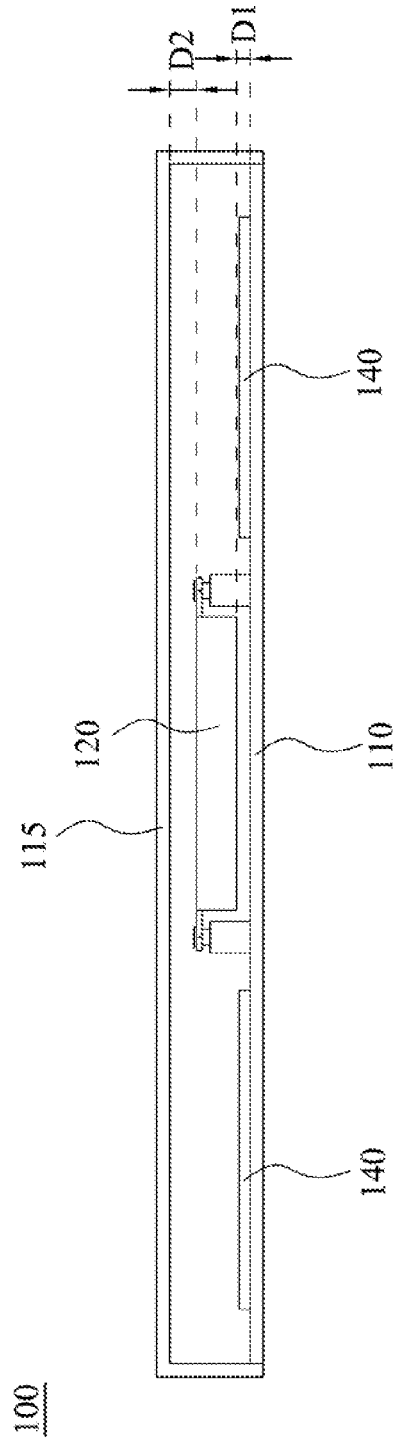
FIGS. 6-8 are schematic sectional views of the electronic apparatus of FIG. 4 upon an impact at the first casing.
Figure 7:
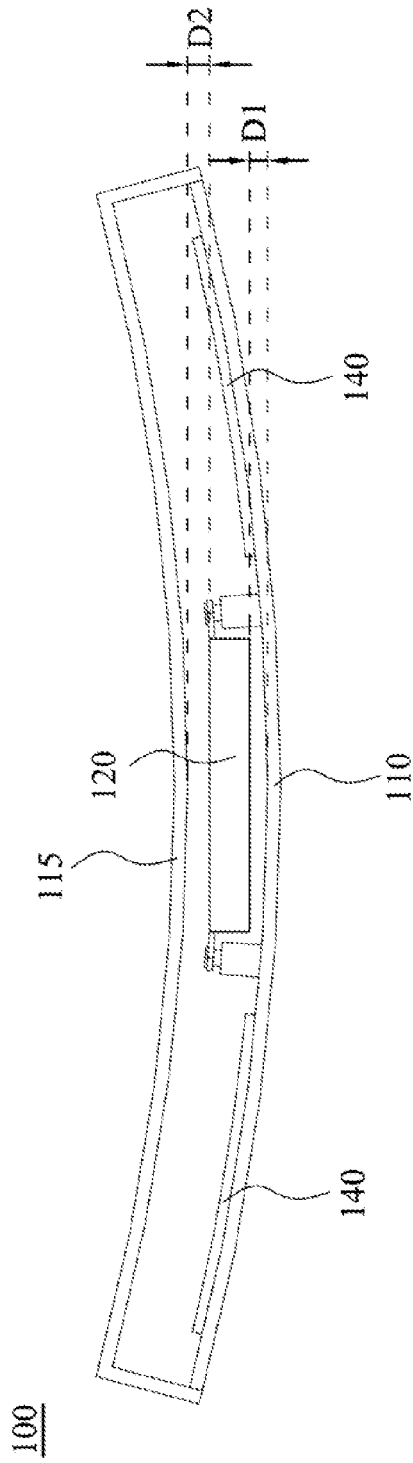
Figure 8:
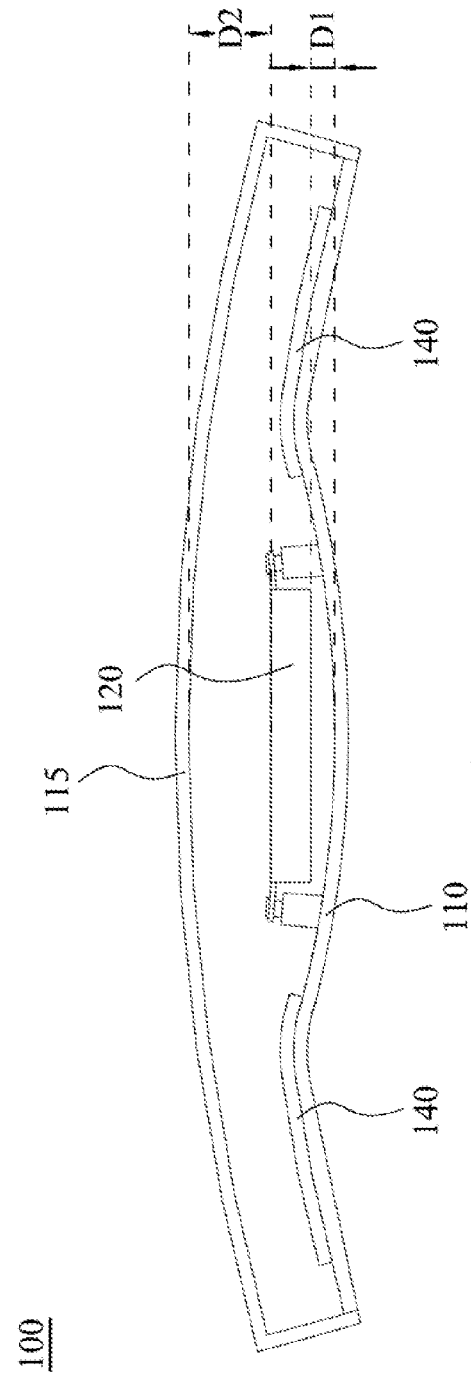

FIG. 4 is a three-dimensional drawing of the electronic apparatus 100 according to the first embodiment of the present disclosure, in which the second casing 115 is removed. FIG. 5 is a function block diagram of the electronic apparatus 100 of FIG. 4. As shown in FIGS. 4-5, an electronic apparatus 100 includes a first casing 110, a protected device 120, a detector 130, an actuator 140 and a controller 150. The protected device 120 is spaced apart from the first casing 110 by a first shortest distance D1 (as shown in FIGS. 6-8). The detector 130 is configured to detect a first early sign before a first collision of the first casing 110 and the protected device 120. The controller 150 is configured to actuate the actuator 140 after the detector 130 has detected the first early sign, causing an increase of the first shortest distance D1 (as shown in FIGS. 6-8), and subsequently the first collision of the first casing 110 and the protected device 120 is avoided. Although in some occasions, the increase of the first shortest distance D1 is insufficient to compensate for the amount of deformation of the first casing 110, such that the first collision of the first casing 110 and the protected device 120 still occurs, while a degree of the first collision can be relatively alleviated.

In this embodiment, the detector 130 includes at least one accelerometer. The accelerometer is configured to detect if the first casing 110 is in a state of weightlessness. The first early sign is determined when the first casing 110 is detected to be in the state of weightlessness.

To be specific, when the first casing 110 is supported by a surface on earth, in order to balance with the self-weight of the first casing 110, the detector 130 (or, the accelerometer) will detect the acceleration due to gravity (approximately equal to 9.81 m/s$^2$). When the first casing 110 loses weight, as the first casing 110 is no longer supported by the surface, the acceleration detected by the detector 130 drops rapidly. Therefore, in this embodiment, when the acceleration detected by the detector 130 (or, the accelerometer) is lower than a threshold, and lasts for a predetermined time period, the first casing 110 is considered to be in the state of weightlessness, and the first early sign is determined. The threshold and the predetermined time period are determined upon the actual needs. In this embodiment, the threshold is in a range from about 400 mg to about 600 mg, and the predetermined time period is in a range from about 10 ms to about 30 ms. It is appreciated that the threshold and the predetermined time period as cited above are only illustrative and are not to limit the claimed scope. The person having ordinary skill in the art of the present disclosure should flexibly choose the threshold and the predetermined time period upon the actual needs.

FIGS. 6-8 are schematic sectional views of the electronic apparatus 100 of FIG. 4 upon an impact at the first casing 110. After the first casing 110 is in the state of weightlessness (as shown in FIG. 6), the first casing 110 will immediately suffer from an impact (as shown in FIG. 7). When the first casing 110 is under the impact, the first casing 110 first bends and deforms due to a force of the impact (as shown in FIG. 7). In case a bending deformation first increases the first shortest distance D1, not much risk of the first collision of the protected device 120 and the first casing 110 is introduced. However, when the first casing 110 rebounds, the bending deformation occurs at the reverse direction (as shown in FIG. 8), which decreases the first shortest distance D1, causing an increase of the risk of the first collision of the protected device 120 and the first casing 110. Therefore, the controller 150 actuates the actuator 140, causing an increase of the first shortest distance D1, such that the first collision of the first casing 110 and the protected device 120 is avoided.

In this article, the term "impact" refers to the mutual contact between the casing (for example, the first casing 110 and/or the second casing 115) and an unspecified object, causing a change and conversion of energy and momentum. The term "collision" specifically refers to the mutual contact between the casing (for example, the first casing 110 and/or the second casing 115) and the protected device 120, causing a change and conversion of energy and momentum.

In this embodiment, the actuator 140 can be a piezoelectric piece, such as a piezoelectric bending piece made of piezoelectric ceramics. The actuator 140 (or, the piezoelectric piece) is located on the first casing 110. After the detector 130 has detected the first early sign, the controller 150 makes the actuator 140 (or, the piezoelectric piece) deform the first casing 110, causing the increase of the first shortest distance D1.

When the first casing 110 is under an impact (as shown in FIG. 7), the detector 130 will detect the impact and start a timer. After a predetermined time period, the controller 150 stops the actuator 140 actuating. In general, since the electronic apparatus 100 suffers from the impact, a response action will be completed in 20 ms. Therefore, in this embodiment, the predetermined time period can be 50 ms. It is appreciated that the predetermined time period as cited above is only illustrative and is not to limit the claimed scope. The person having ordinary skill in the art of the present disclosure should flexibly choose the length of the predetermined time period upon the actual needs.

In an example of the present disclosure, the actuator 140 is lead zirconium titanium (PZT), with a response time of 2 ms. Therefore, the data above can prove that the response time of the piezoelectric piece can surely make the first shortest distance D1 instantly increase when the first casing 110 rebounds, such that the first collision of the first casing 110 and the protected device 120 is avoided.

In this embodiment, the quantity of the actuator 140 (or, the piezoelectric piece) is two. The actuators 140 (or, the piezoelectric pieces) can be located respectively at opposite sides of the protected device 120. It is appreciated that the configuration of the actuator 140 (or, the piezoelectric piece) as cited above is only illustrative and is not to limit the claimed scope. The person having ordinary skill in the art of the present disclosure should flexibly choose the mode of configuration of the actuator 140 (or, the piezoelectric piece) upon the actual needs.

Referring back to FIG. 5, in practice, the controller 150 can include an embedded controller/keyboard controller 152 (EC/KBC). After the detector 130 has detected the first early sign, the embedded controller/keyboard controller 152 will produce a control signal to the actuator 140, actuating the actuator 140. In the compatible personal computer of International Business Machines Corp. (IBM), the embedded controller/keyboard controller 152 is an embedded controller under a low pin count bus (LPC). This embedded controller usually possesses the function of keyboard control. Moreover, this embedded controller also possesses many functions communicating with other hardware, such as power management, volume control and temperature control, etc. Therefore, in this embodiment, the electronic apparatus 100 can apply the embedded controller/keyboard controller 152, to produce the control signal to the actuator 140. In practice, the embedded controller/keyboard controller 152 can be a single chip microprocessor.

To be more specific, in this embodiment, when the acceleration detected by the detector 130 (or, the accelerometer) is lower than a threshold, and has lasted for a predetermined time period, the detector 130 (or, the accelerometer) will produce a trigger signal to the embedded controller/keyboard controller 152. After the embedded controller/keyboard controller 152 has received the trigger signal, the control signal (such as an appropriate forward voltage) will be produced to the actuator 140, so as to actuate the actuator 140.

It is appreciated that since most of the notebook computers or other electronic apparatus have the embedded controller/keyboard controller 152, the embedded controller/keyboard controller 152 can be applied directly as the controller 150 in this embodiment, and no additional installation of the controller 150 is required. However, this does not limit the claimed scope. If the actual conditions allow, the person having ordinary skill in the art of the present disclosure can apply other hardware, firmware, software or any combination of the above as the controller 150.

In this embodiment, if the control signal produced by the embedded controller/keyboard controller 152 is insufficient to actuate the actuator 140, an operational amplifier 154 can be additionally installed between the embedded controller/keyboard controller 152 and the actuator 140. The operation amplifier 154 is configured to amplify the control signal and provide an amplified control signal to the actuator 140.

Referring back to FIGS. 6-8. In this embodiment, the electron apparatus 100 further includes a second casing 115. The second casing 115 is disposed opposite to the first casing 110 and is spaced apart from the protected device 120 by a second shortest distance D2. As the first shortest distance D1 is closer than the second shortest distance D2, the risk of the first collision of the first casing 110 and the protected device 120, is higher than the risk of a second collision of the second casing 115 and the protected device 120. Therefore, in this embodiment, the actuator 140 can be installed on the first casing 110 of a higher risk of the first collision. In this embodiment, the protected device 120 includes precision machinery, storage device, hard drive, CD-ROM drive, floppy drive, optical device, lens, zooming mechanism, aperture mechanism, shutter mechanism or any combination of the above. It is appreciated that the protected device 120 as cited above is only illustrative and is not to limit the claimed scope. The person having ordinary skill in the art of the present disclosure should flexibly choose the embodiment of the protected device 120 upon the actual needs.

The Second Embodiment

Figures 9, 10:
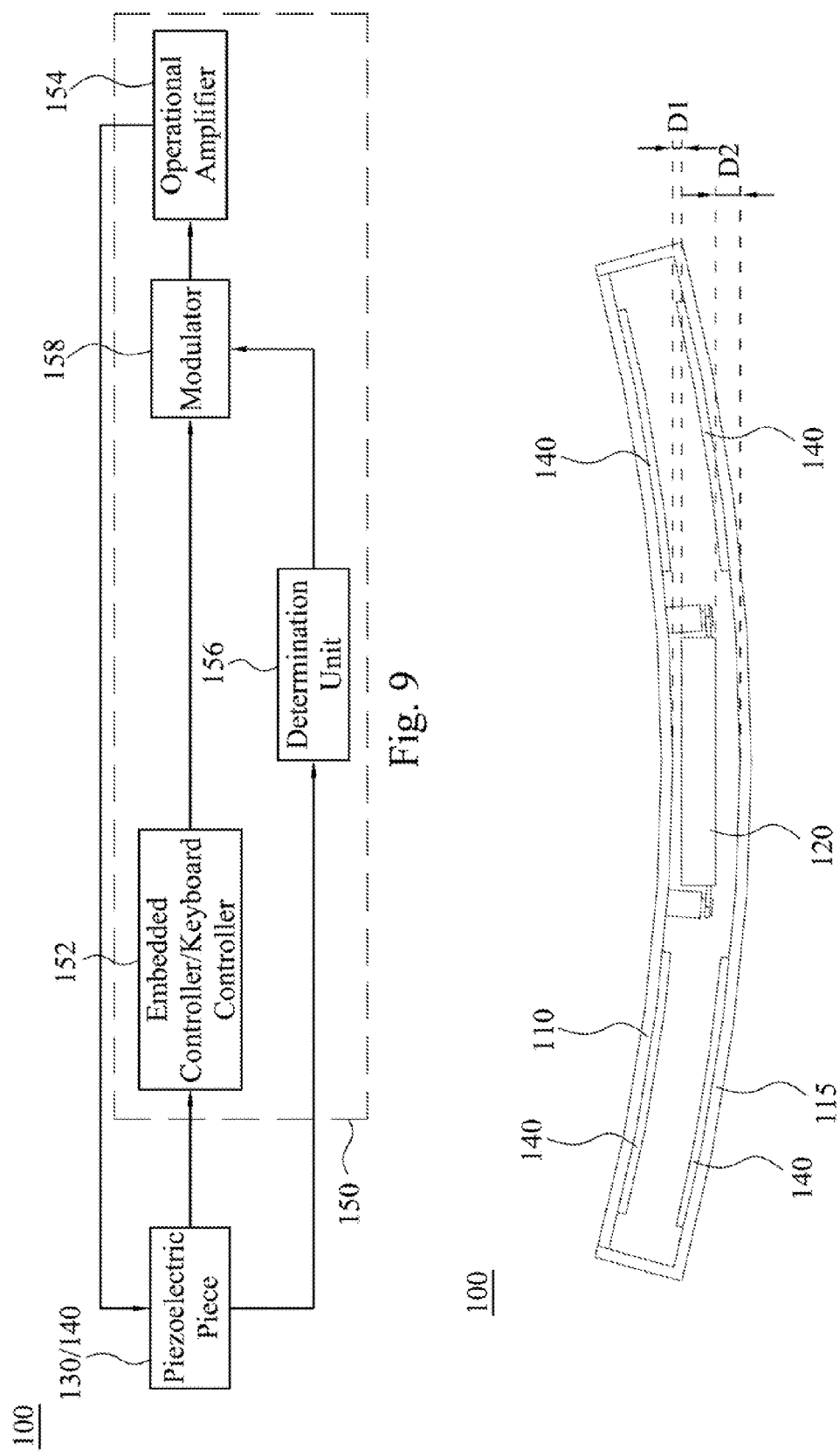
FIG. 9 is a function block diagram of the electronic apparatus according to the second embodiment of the present disclosure.
FIGS. 10-11 are schematic sectional views of the electronic apparatus, according to the third embodiment of the present disclosure, upon an impact at the second casing.

FIG. 9 is a function block diagram of the electronic apparatus 100 according to the second embodiment of the present disclosure. The difference between this embodiment and the first embodiment is that: this embodiment directly applies the piezoelectric piece as the detector 130, while omitting the set up of the accelerometer.

Generally speaking, there are two types of piezoelectric effect of the piezoelectric piece. One is the direct piezoelectric effect; another is the converse piezoelectric effect. When the piezoelectric piece is subjected to an electric field, an electric dipole moment will be stretched or shortened, such that the piezoelectric piece deforms. This converts an electrical energy to a mechanical energy. This is known as the direct piezoelectric effect. In contrast, when the piezoelectric piece deforms, the electric dipole moment in the piezoelectric piece will also change with the deformation. In order to resist against this tendency, the piezoelectric piece will produce an electric voltage to maintain its original state. This is known as the converse piezoelectric effect.

When the first casing 110 suffers from an impact, the first casing 110 first bends and deforms due to a force of the impact (as shown in FIG. 7). This bending deformation deforms the piezoelectric piece (or, the actuator 140), such that the piezoelectric piece (or, the actuator 140) produces the electric voltage due to the converse piezoelectric effect. When the electric voltage reaches a threshold, the first early sign is determined.

Therefore, in this embodiment, apart from the configuration as the actuator 140, the piezoelectric piece can also be configured as the detector 130 for use, so as to detect if the first casing 110 deforms upon the impact. When the first casing 110 deforms upon the impact, the first early sign is determined. After the first early sign is determined, the controller 150 stops monitoring the electric voltage of the piezoelectric piece, and provides a control signal to the piezoelectric piece, forcing the piezoelectric piece to deform.

It is appreciated that apart from the application of the whole of the piezoelectric piece (or, the actuator 140) on the first casing 110 as the detector 130, only a part can also be applied as the detector 130. The person having ordinary skill in the art of the present disclosure should flexibly choose the embodiment of the detector 130 upon the actual needs.

In addition, the controller 150 of this embodiment further includes a determination unit 156 and a modulator 158. The determination unit is configured to determine a degree of the impact received by the first casing 110 according to the first early sign. The modulator 158 is configured to modulate the control signal according to the degree of the impact received by the first casing 110, such that the actuator 140 can correspondingly modulate the first shortest distance D1 according to the degree of the impact received by the first casing 110.

To be specific, the higher a degree of the deformation of the first casing 110 upon the impact, the higher will be the degree of the deformation on the rebound of the first casing 110, leading to a higher risk of the first collision of the first casing 110 and the protected device 120. Moreover, as the degree of the deformation of the first casing 110 upon the impact is positively related to the electric voltage generated by the piezoelectric piece (or, the detector 130/the actuator 140), the higher the electric voltage generated by the piezoelectric piece (or, the detector 130/the actuator 140), the higher will be the degree of the deformation of the first casing 110 upon impact.

Therefore, in this embodiment, the determination unit 156 can determine the degree of the impact received by the first casing 110 according to the electric voltage generated by the piezoelectric piece (or, the detector 130/the actuator 140). Consequently, the modulator 158 can modulate the control signal according to this, such that the piezoelectric piece (or, the detector 130/the actuator 140) can modulate the degree of the deformation according to the degree of the impact received by the first casing 110. This manner can reduce the degree of the deformation of the piezoelectric piece (or, the detector 130/the actuator 140) when the degree of the impact received by the first casing 110 is relatively small, so as to save the use of an electric power. Moreover, apart from a continuous mode, the modulation above can also be of a step-by-step mode. The person having ordinary skill in the art of the present disclosure should flexibly choose it upon the actual needs.

Other relevant structure and operating details will not be described repeatedly here, as they are all the same as the first embodiment.

The Third Embodiment

Figure 11:
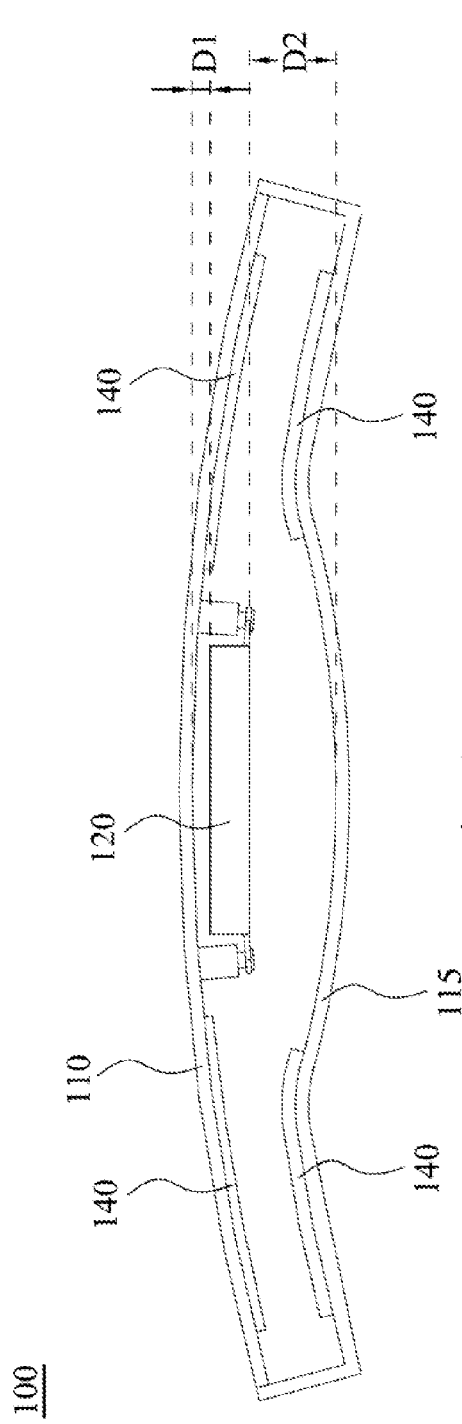

FIGS. 10-11 are schematic sectional views of the electronic apparatus 100, according to the third embodiment of the present disclosure, upon an impact at the second casing 115. The difference between this embodiment and the first embodiment is that: this embodiment has also the actuator 140 on the second casing 115. Moreover, the detector 130 is further configured to detect a second early sign of the second collision of the second casing 115 and the protected device 120. The controller 150 is further configured to actuate the actuator 140 on the second casing 115 after the detector 130 has detected the second early sign, causing an increase of the second shortest distance D2.

To be more specific, when the detector 130 is the accelerometer, as the acceleration detected has a direction, the upcoming impact on the first casing 110 or the second casing 115 can be predicted (i.e., the first early sign or the second early sign can be determined) according to the change of the direction of the acceleration. On the other hand, when the detector 130 is a piezoelectric piece, the impact on the first casing 110 or the second casing 115 can be determined according to the casing on which the piezoelectric piece is generating the electric voltage.

Although FIGS. 6-8, 10-11 are schematic views of the actuator 140 installed on the main surface of the first casing 110 and/or the second casing 115 facing to the protected device 120, this does not limit the claimed scope. The person having ordinary skill in the art of the present disclosure can also choose to install the actuator 140 on other surfaces. For example, in some embodiments of the present disclosure, the side of the second casing 115 facing to the protected device 120 can also have the actuator 140, and in these embodiments, if the detector 130 is the accelerometer, a multi-axial accelerometer can be chosen, so as to determine which part of the casing is about to suffer from the impact, according to the change of the direction of the acceleration. The person having ordinary skill in the art of the present disclosure should flexibly choose the embodiment of the actuator 140 upon the actual needs.

Other relevant structure and operating details will not be described repeatedly here, as they are all the same as the first embodiment.

The Fourth Embodiment

Figure 12:
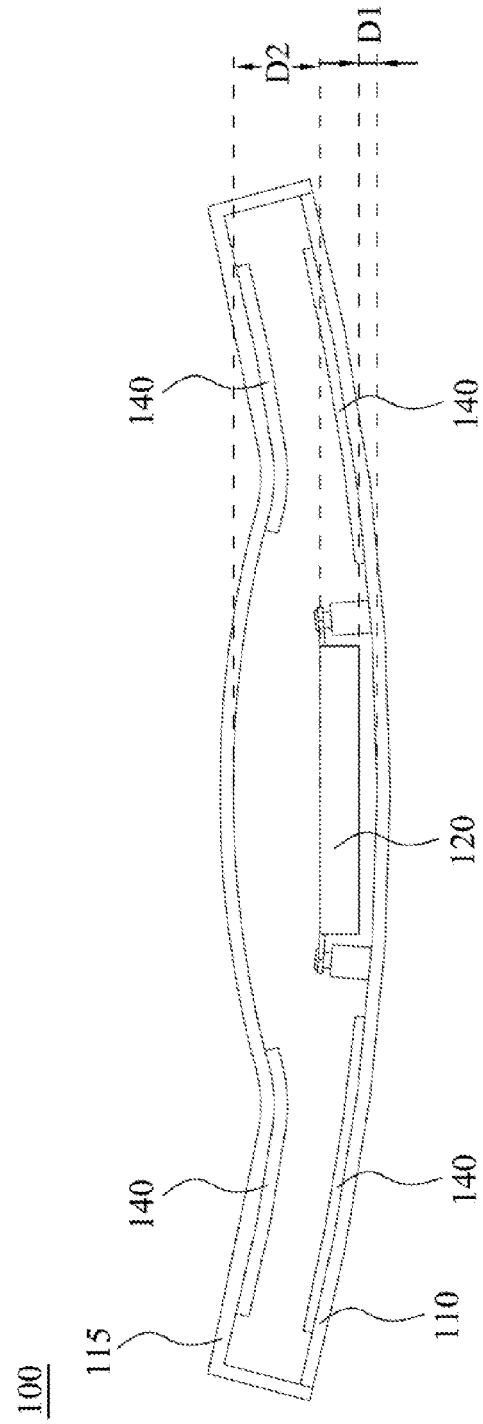

FIGS. 12-13 are schematic sectional views of the electronic apparatus 100, according to the fourth embodiment of the present disclosure, upon an impact at the first casing 110. The difference between this embodiment and the third embodiment is that: the detector 130 in this embodiment is an accelerometer, and the controller 150 will first actuate the actuator 140 on the second casing 115 after the first early sign is determined, causing the increase of the second shortest distance D2 (as shown in FIG. 12). Then, it actuates the actuator 140 on the first casing 110 (as shown in FIG. 13), causing the increase of the first shortest distance D1.

To be specific, when the detector 130 is the accelerometer, as the first early sign can be produced before the occurrence of the first collision, the second shortest distance D2 can be first increased at the time the first casing 110 deforms upon the impact (as shown in FIG. 12), avoiding the second collision of the second casing 115 and the protected device 120.

Other relevant structure and operating details will not be described repeatedly here, as they are all the same as the third embodiment.

The Fifth Embodiment

Figure 15:
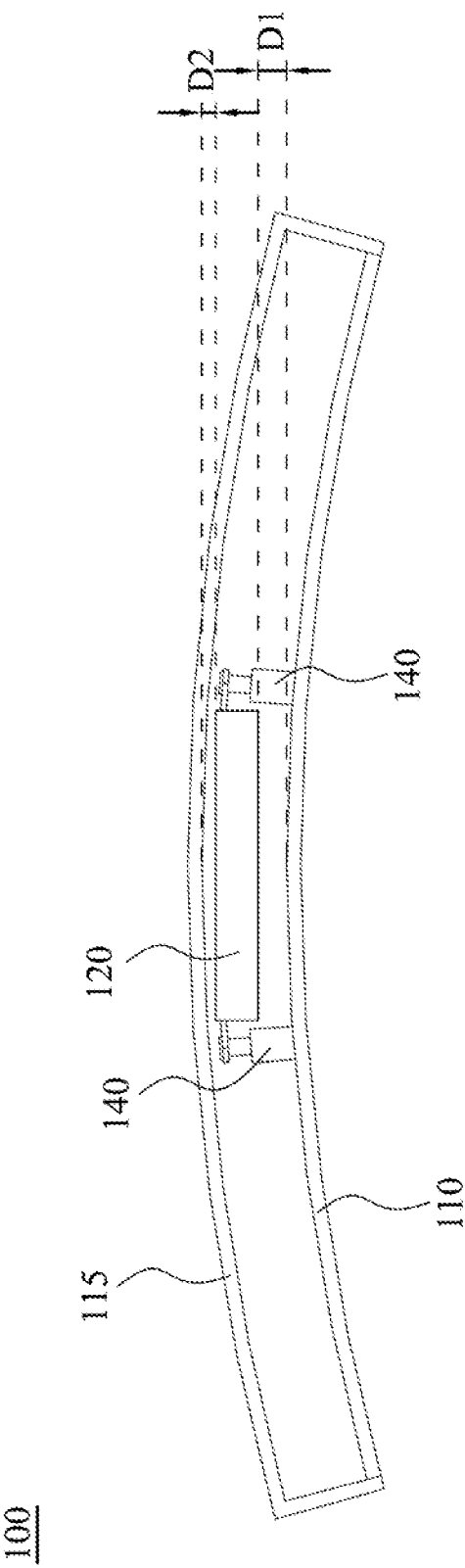

FIGS. 14-15 are schematic sectional views of the electronic apparatus 100, according to the fifth embodiment of the present disclosure, upon an impact at the first casing 110. The difference between this embodiment and the first embodiment is that: the actuator 140 of this embodiment includes a linear actuator. The linear actuator connects the protected device 120 and the first casing 110. After the detector 130 has detected the first early sign, the controller 150 make the linear actuator (i.e., the actuator 140) move the protected device 120 in a direction away from the first casing 110.

Other relevant structure and operating details will not be described repeatedly here, as they are all the same as the first embodiment.

Another technical aspect of the present disclosure is the protecting method of the electronic apparatus 100 of the embodiment above.

Figures 16, 17:
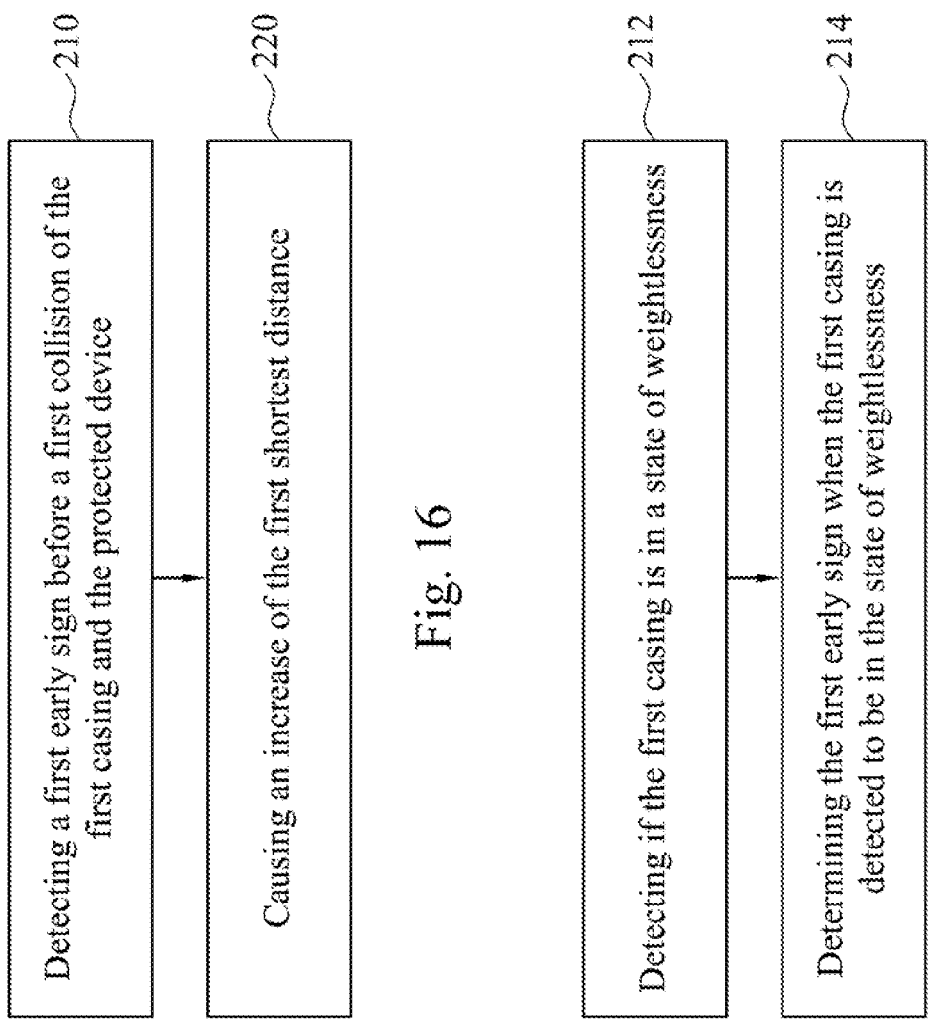
FIG. 16 is a flow chart of the protecting method of the electronic apparatus according to one embodiment of the present disclosure.
FIG. 17 is a flow chart of the step 210 of FIG. 16.

FIG. 16 is a flow chart of the protecting method of the electronic apparatus 100 according to one embodiment of the present disclosure. As shown in FIG. 16, the protecting method of the embodiment includes the following steps (it is appreciated that the sequence of the steps and the sub-steps as mentioned below, unless otherwise specified, can all be adjusted upon the actual needs, or even executed at the same time or partially at the same time.):

(1) Utilizing the detector 130 to detect a first early sign before a first collision of the first casing 110 and the protected device 120. (step 210)

(2) Actuating the first actuator 140 on the first casing 110 after the first early sign is detected, causing an increase of the first shortest distance D1, so as to avoid the first collision of the first casing 110 and the protected device 120. (step 220)

FIG. 17 is a flow chart of the step 210 of FIG. 16. As shown in FIG. 17, the step 210 further includes the following sub-steps:

(1.1') Utilizing the detector 130 to detect if the first casing 110 is in a state of weightlessness. (step 212)

(1.2') Determining the first early sign when the first casing is detected to be in the state of weightlessness. (step 214)

FIG. 18 is a flow chart of the step 210 according to another embodiment of the present disclosure. As shown in FIG. 18, the step 210 further includes the following sub-steps:

(1.1) Utilizing the detector 130 to detect if the first casing 110 deforms upon an impact. (step 213)

(1.2") Determining the first early sign when the first casing 10 deforms upon the impact. (step 215)

Referring back to FIG. 16. In some embodiments of the present disclosure, the step 220 further includes the following sub-steps:

(2') Making the first actuator 140 on the first casing 110 deform the first casing 110, causing the increase of the first shortest distance D1.

In some embodiments of the present disclosure, the step 220 includes the following sub-steps:

(2") The first actuator 140 on the first casing 110 moves the protected device 120 in a direction away from the first casing 110.

FIG. 19 is a flow chart of the step 220 of FIG. 16. As shown in FIG. 19, the step 220 includes the following sub-steps:

(2.1) Utilizing a determination unit 156 to determine a degree of an impact received by the first casing 110 according to the first early sign. (step 222)

(2.2) Utilizing a modulator 158 to correspondingly modulate the first shortest distance D1 according to the degree of the impact received by the first casing 110. (step 224)

Figure 20:
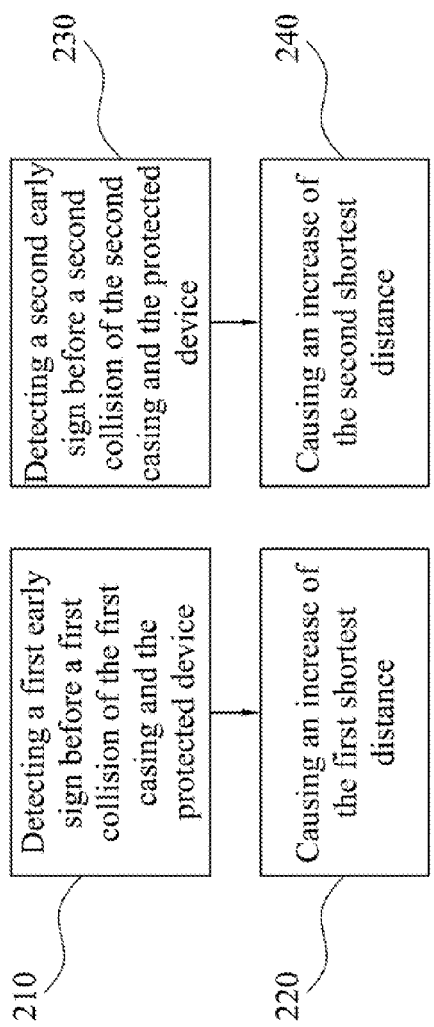
FIG. 20 is a flow chart of the protecting method of the electronic apparatus according to another embodiment of the present disclosure.

FIG. 20 is a flow chart of the protecting method of the electronic apparatus 100 according to another embodiment of the present disclosure. As shown in FIG. 20, the protecting method further includes the following steps:

(3) Utilizing the detector 130 to detect a second early sign before a second collision of the second casing 115 and the protected device 120, in which the second casing 115 and the first casing 110 are disposed oppositely. (step 230)

(4) Actuating the actuator 140 on the second casing 115 after the second early sign is detected, causing an increase of a second shortest distance D2 between the second casing 115 and the protected device 120. (step 240)

Figure 21:
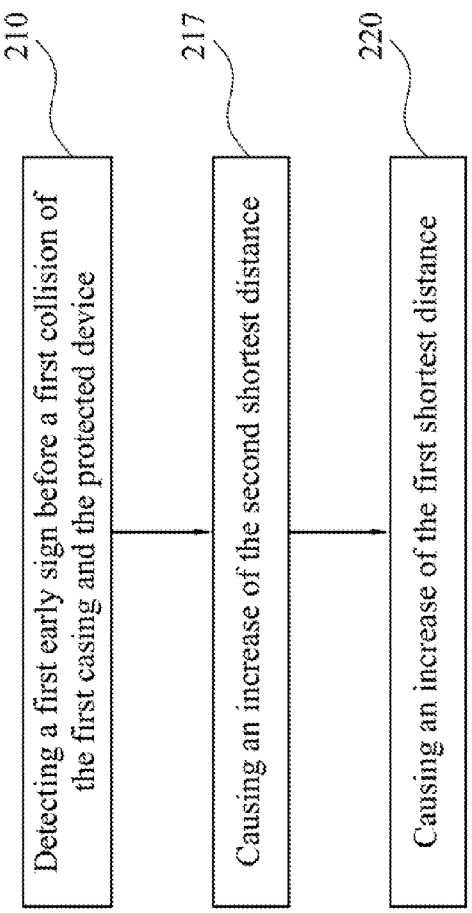
FIG. 21 is a flow chart of the protecting method of the electronic apparatus according to a further embodiment of the present disclosure.

FIG. 21 is a flow chart of the protecting method of the electronic apparatus 100 according to a further embodiment of the present disclosure. As shown in FIG. 21, the protecting method further includes the following step:

(1.5) Actuating the actuator 140 on the second casing 115 after the first early sign is detected and before the actuator 140 on the first casing 110 actuates, causing an increase of the second shortest distance D2 between the second casing 115 and the protected device 120, in which the second casing 115 and the first casing 110 are disposed oppositely. (step 217)

Although the present disclosure has been described in considerable detail with reference to certain embodiments thereof, other embodiments are possible. Therefore, their spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An electronic apparatus, comprising:
    a first casing;
    a protected device, spaced apart from the first casing by a first shortest distance;
    a detector, configured to detect a first early sign before a first collision of the first casing and the protected device;
    a first actuator; and
    a controller, configured to actuate the first actuator after the detector detects the first early sign, causing an increase of the first shortest distance, wherein the controller makes the first actuator deform the first casing after the detector detects the first early sign.

2. The electronic apparatus of claim 1, wherein the detector comprises:
    at least one accelerometer, configured to detect if the first casing is in a state of weightlessness, wherein the first early sign is determined when the first casing is detected to be in the state of weightlessness.

3. The electronic apparatus of claim 1, wherein the first actuator comprises:
    at least one piezoelectric piece, located on the first casing, wherein after the detector detects the first early sign, the controller makes the piezoelectric piece deform the first casing, causing the increase of the first shortest distance.

4. The electronic apparatus of claim 3, wherein the quantity of the piezoelectric pieces is two, and the piezoelectric pieces are located respectively at opposite sides of the protected device.

5. The electronic apparatus of claim 1, wherein the first actuator comprises:
    at least one linear actuator, connecting the protected device and the first casing, wherein after the detector detects the first early sign, the controller makes the linear actuator move the protected device in a direction away from the first casing.

6. The electronic apparatus of claim 1, wherein the controller comprises:
    an embedded controller/keyboard controller, configured to produce a control signal to the first actuator after the detector detects the first early sign, so as to actuate the first actuator.

7. The electronic apparatus of claim 6, wherein the controller further comprises:
    an operational amplifier, configured to amplify the control signal and provide an amplified control signal to the first actuator.

8. The electronic apparatus of claim 6, wherein the controller further comprises:
    a determination unit, configured to determine a degree of an impact received by the first casing according to the first early sign; and a modulator, configured to modulate the control signal according to the degree of the impact received by the first casing, such that the first actuator can correspondingly modulate the first shortest distance according to the degree of the impact received by the first casing.

9. The electronic apparatus of claim 1, wherein the detector comprises:
    at least one piezoelectric piece, located on the first casing and configured to detect if the first casing deforms upon an impact, wherein when the first casing deforms upon the impact, the first early sign is determined to be present.

10. The electronic apparatus of claim 9, wherein the first actuator comprises:
    the piezoelectric piece, wherein after the detector detects the first early sign, the controller makes the piezoelectric piece deform the first casing, causing the increase of the first shortest distance.

11. The electronic apparatus of claim 1, further comprising:
    a second casing, disposed opposite to the first casing and spaced apart from the protected device by a second shortest distance; and
    a second actuator;
    wherein the detector is further configured to detect a second early sign before a second collision of the second casing and the protected device; and
    wherein the controller is further configured to actuate the second actuator after the detector detects the second early sign, causing an increase of the second shortest distance.

12. The electronic apparatus of claim 1, further comprising:
    a second casing, disposed opposite to the first casing and spaced apart from the protected device by a second shortest distance; and
    a second actuator;
    wherein the detector is configured to first actuate the second actuator after the detector detects the first early sign, causing an increase of the second shortest distance, and then actuate the first actuator, causing the increase of the first shortest distance.

13. A protecting method of an electronic apparatus, the electronic apparatus comprising a first casing, a protected device, a detector and a first actuator, wherein the protected device and the first casing being spaced apart by a first shortest distance, the protecting method comprising:
    utilizing the detector to detect a first early sign before a first collision of the first casing and the protected device; and
    actuating the first actuator after the first early sign is detected, causing an increase of the first shortest distance,
    wherein actuating the first actuator, causing the increase of the first shortest distance further comprises:
    making the first actuator deform the first casing, causing the increase of the first shortest distance.

14. The protecting method of claim 13, wherein utilizing the detector to detect the first early sign before the first collision of the first casing and the protected device further comprises:
    utilizing the detector to detect if the first casing is in a state of weightlessness; and
    determining the first early sign when the first casing is detected to be in the state of weightlessness.

15. The protecting method of claim 13, wherein actuating the first actuator, causing the increase of the first shortest distance further comprises:

making the first actuator move the protected device in a direction away from the first casing.

16. The protecting method of claim 13, wherein actuating the first actuator, causing the increase of the first shortest distance further comprises:
   utilizing a determination unit to determine a degree of an impact received by the first casing according to the first early sign; and
   utilizing a modulator to correspondingly modulate the first shortest distance according to the degree of the impact received by the first casing.

17. The protecting method of claim 13, wherein utilizing the detector to detect the first early sign before the first collision of the first casing and the protected device further comprises:
   utilizing the detector to detect if the first casing deforms upon an impact; and
   determining the first early sign when the first casing deforms upon the impact.

18. The protecting method of claim 13, further comprising:
   utilizing the detector to detect a second early sign before a second collision of a second casing and the protected device, wherein the second casing and the first casing are disposed oppositely; and
   actuating a second actuator after the second early sign is detected, causing an increase of a second shortest distance between the second casing and the protected device.

19. The protecting method of claim 13, further comprising:
   actuating a second actuator after the first early sign is detected and before the first actuator actuates, causing an increase of a second shortest distance between a second casing and the protected device, wherein the second casing and the first casing are disposed oppositely.

* * * * *